United States Patent [19]

Proebsting

[11] 4,347,589
[45] Aug. 31, 1982

[54] REFRESH COUNTER TEST

[75] Inventor: Robert J. Proebsting, Dallas, Tex.

[73] Assignee: Mostek Corporation, Carrollton, Tex.

[21] Appl. No.: 235,180

[22] Filed: Feb. 17, 1981

Related U.S. Application Data

[63] Continuation of Ser. No. 39,248, May 15, 1979, abandoned.

[51] Int. Cl.³ .............................................. G11C 13/00
[52] U.S. Cl. .................................... 365/222; 365/189
[58] Field of Search ....................... 365/222, 189, 230

[56] References Cited

U.S. PATENT DOCUMENTS 3,737,879  5/1973  Greene et al. ...................... 365/222

Primary Examiner—Terrell W. Fears

[57] ABSTRACT

A circuit to permit testing the refresh counter in an integrated circuit memory by writing into cells whose row addresses are determined by the refresh counter.

6 Claims, 2 Drawing Figures

REFRESH COUNTER TEST

This is a continuation of application Ser. No. 39,248, filed May 15, 1979, now abandoned.

BACKGROUND OF THE INVENTION

1. Field of the the Invention

This invention relates to random access memories and more particularly, but not by way of limitation, to testing the refresh function in a random access memory.

2. Description of the Prior Art

Basically the refresh function is required in dynamic memories to keep data from being lost as a result of charge leaking off memory cells over a period of time. The charge will leak off over a period of time and it is periodically restored back to its initial value by a function called "refresh." This refresh function operates on one row of memory at a time or with certain groupings of maybe two or four rows, but normally a very small fraction of the total number of rows. It is necessary to have some means, either internal within the chip or external within the system, of cycling through all the rows to refresh all of the rows within some period of time, typically in the industry about 2 milliseconds, before any given row must be refreshed again.

In the case of many random access memories (RAMs) to date, the refresh counter has been external; that is, there is a counter off the chip which cycles through and keeps track of which row was most recently refreshed and increments and refreshes the next row during the next refresh cycle. Thus, the refresh counter is required to cycle through all the rows, one row at a time, or sometimes possibly two or four rows at a time. The counter keeps track of what row has been refreshed, and cycles through until all of the rows have been refreshed within some period of time, again say 2 milliseconds. The cycle then continues, so a cycle of row n followed by row n+1 followed by row n+2, etc. is performed until all the way through to row n again within 2 milliseconds, repeatedly.

To test the functionality of a random access memory without an internal refresh counter is fairly straightforward. A variety of input data patterns are written into the memory and then read out to see that they exist in their entirety exactly as written. With the proper choice of patterns, this test confirms that all circuitry performs properly including the row selection and column selection circuitry. In addition, in most memory designs, such a test also confirms that a refresh function occurs on the selected row since in this case selection of a given row automatically refreshes that row. However, other RAMs have a refresh counter on the chip, and there is a very real problem in testing the refresh function on this part. The output of the refresh counter cannot be read directly. A definitive test requires the write-in of data followed by a waiting period of at least long enough that the very best bit, that is a bit that has the very longest charge retention time, will guarantee to fail. When an industry specification is 2 milliseconds, meaning that all of the bits will hold data for at least 2 milliseconds, many of the bits will hold data for 200 milliseconds, or even longer. Thus, a refresh cycle at 100 millisecond intervals may show that no bits have failed. Yet, that does not mean that there is not a row that was skipped by the counter as all of the bits in that row may have happened to have a refresh time that exceeded 100 milliseconds.

If there is a potential failure at 200 milliseconds, or maybe 500 milliseconds, a situation is reached where there must be a compromise between a very long test time and not absolutely guaranteeing that the part will work. To absolutely guarantee that the refresh function of the part works would require a wait long enough to be absolutely certain that a good bit would have failed without refresh. Therefore, refreshing a long enough time to guarantee that the refresh function works means taking a very long time in a test that is using some very expensive equipment. Further, less time is desirable to have a greater manufacturing throughput.

SUMMARY OF THE INVENTION

This invention includes writing in a uniform background into the memory. Then the refresh means is cycled, normally locking out other circuitry on the chip including the read and write circuitry, a desirable system feature. So normally, then, a refresh command activates the refresh circuitry, and a row addressed by the refresh counter rather than by an external address is cycled. If a column address strobe and a write command are given, the chip will normally ignore the signals and the write will not occur.

However, the row address strobe ($\overline{RAS}$) is not ignored during refresh, although it normally selects an external address rather than an internal address. A refresh command selects a row whose address is determined by the refresh counter. During the test mode of this invention, the refresh command is followed by a $\overline{RAS}$ command. If a column address strobe ($\overline{CAS}$) and a write command are then given, a bit is addressed and written by the combination. Thus, the selected row for this test is being addressed by the refresh counter. The selected column may be either a column addressed by the refresh counter or a column externally addressed.

Now the above sequence is repeated until each row should have been selected and therefore written exactly once. If the refresh counter is working, it has gone to each row and if it is not working, it will have skipped one or more rows. A normal read of the memory, not using the refresh counter, is performed to see that the correct pattern was written over the background. If in each row the appropriate column is in fact written into, the refresh counter had to enable that row. If a circuit passes this test, the refresh counter is guaranteed to operate properly.

Further, if the column information is written into a different location in each column, such as Column 1 when refreshing the first row, column 2 on the next row, etc., it guarantees that each column is written only once. If, for example, the refresh counter somehow activated more rows than intended, the read-out would indicate this. Thus, this invention provides a means of normally disabling the $\overline{CAS}$ and write circuitry when in a refresh function, yet enabling the $\overline{CAS}$ and write circuitry when in a refresh counter test mode.

Basically, $\overline{RAS}$ would normally strobe in a given row, $\overline{CAS}$ would strobe in a given column, and write would write the data of the data input into that addressed row and column. This invention adds a new sequence in which the refresh command strobes in a row address internally generated by the refresh counter, followed by $\overline{RAS}$ enabling the $\overline{CAS}$ and write functions, and then followed by $\overline{CAS}$ strobing in either the column whose address is dictated by the refresh counter or an address externally generated. The write command then writes the selected bit, which may be read in a normal fashion to verify refresh counter operation.

DESCRIPTION OF THE PREFERRED EMBODIMENT

Figure 1:
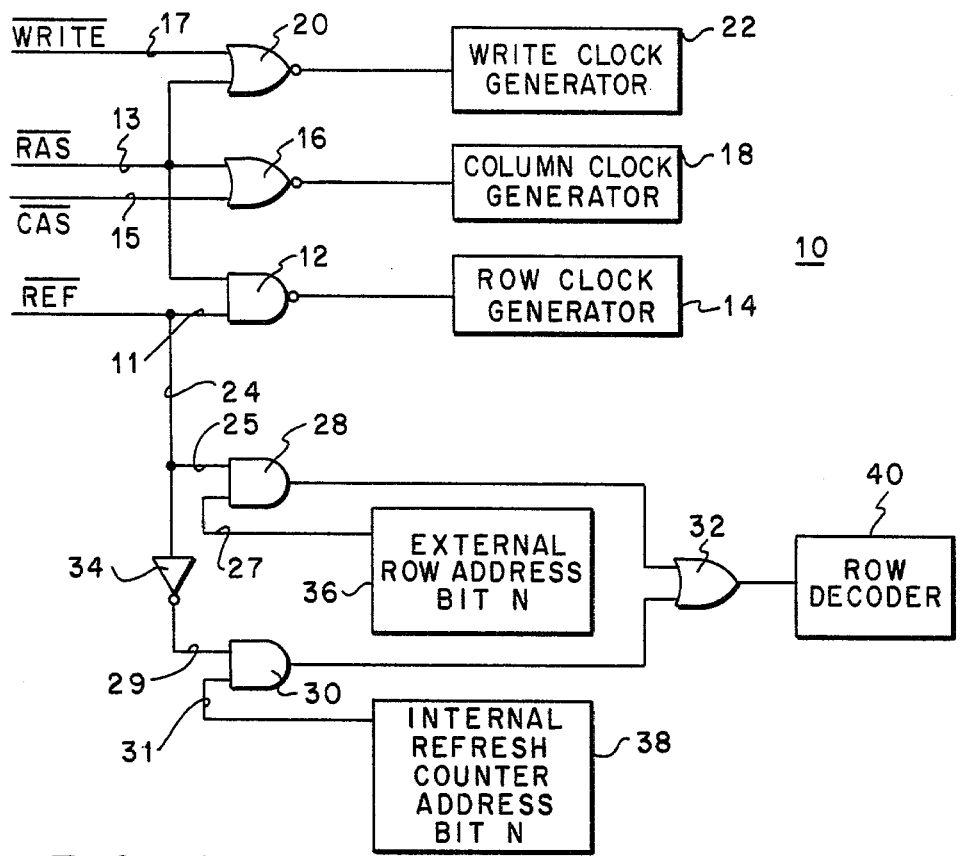
FIG. 1 is a block diagram of one embodiment of the invention.

Referring now to FIG. 1, the invention is shown generally at 10. A NAND-gate 12 receives inputs refresh 11 and row address strobe ($\overline{RAS}$) 13. A row clock generator 14, as in an ordinary memory, is driven by the output of NAND-gate 12. NOR-gate 16 is shown receiving the $\overline{RAS}$ input 13 and the column address strobe ($\overline{CAS}$) 15. The output of the NOR-gate 16 drives the column clock generator 18. Also shown is a NOR-gate 20 receiving the $\overline{RAS}$ command 13 and a write signal 17. The output of the NOR-gate 20 drives the write clock generator 22. Therefore when the $\overline{RAS}$ and refresh inputs are not both high, the row clock generator 14 will be operative. A normal state for the refresh and $\overline{RAS}$ signals 11 and 13 is high as shown in the timing diagram in FIG. 2. NOR-gate 16 will drive the column clock generator 18 when $\overline{RAS}$ 13 and $\overline{CAS}$ 15 inputs are both low.

Figure 2:
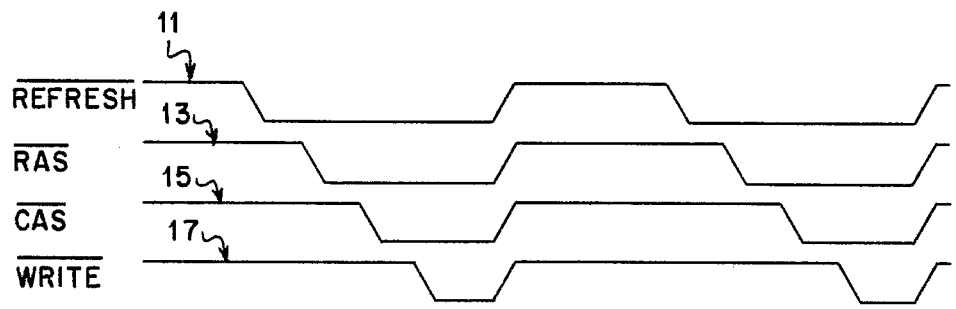
FIG. 2 is a timing diagram cooperating with the embodiment shown in FIG. 1.

Referring now to FIG. 2 under the operation of this invention, the refresh 11 goes low, enabling the row clock generator 14 and selecting the internal refresh counter address. $\overline{CAS}$ 15 follows, thereby enabling the column clock generator 18. Shortly after this point, the write signal 17 goes low enabling the NOR-gate 20 and driving the write clock generator 22.

Signal line 24 can be seen leading from the refresh 11 to an input 25 to an AND-gate 28. Signal line 24 also leads of the input of an inverter 34 whose output 29 is an input to AND-gate 30. AND-gate 28 receives its other input 27 from an external row address 36. AND-gate 30 receives its second input 31 from the internal refresh counter 38. The output of the AND-gate 28 and that of AND-gate 30 are inputs to an OR-gate 32 which provides one address bit to row decoder 40. Thus it can be seen when the refresh signal 11 goes low as a normal part of the refresh counter test sequence, the AND-gate 28 will be disabled and the AND-gate 30 will be enabled. In this way the external row address 36 has no effect. The internal refresh counter address 38 will propagate through the AND-gate 30. This will be passed through the OR-gate 32 to the row decoder 40. Note that in a normal operation when the refresh 11 is high, the AND-gate 28 is enabled to be driven by the external row address 36, while AND-gate 30 is disabled.

While rather specific terms have been used to describe one embodiment of the present invention, these are not intended nor should they be construed as a limitation on the invention as defined by the following claims. The invention has been shown and described with reference to certain preferred embodiments thereof, but it will be understood that various changes in form and detail may be made therein without departing from the spirit and scope of the invention as defined by the appended claims.

What is claimed is:

1. In a memory having a refresh counter, row clock generator and column clock generator, a method for testing the operation of the refresh counter comprising:
   writing a preselected background into the memory;
   enabling the row clock generator with a refresh signal;
   selecting a row determined by the refresh counter;
   enabling the column clock generator;
   writing in the memory in the row selected by the refresh counter; and
   reading the memory to determine correct operation of the refresh counter.

2. The method of claim 1 wherein the column address is determined by the refresh counter.

3. The method of claim 1 wherein the column address is externally supplied to the memory.

4. In a memory having a refresh counter, a row clock generator, a column clock generator, a write clock generator, and a row decoder, a circuit for testing the refresh counter comprising:
   a NAND-gate for receiving refresh and row address strobes and driving the row clock generator;
   a first NOR-gate for receiving the row address strobe and a write strobe and driving the column clock generator;
   a second NOR-gate for receiving the row address strobe and a write strobe and driving the write clock generator;
   a first AND-gate for receiving an external row address and the refresh strobe;
   an inverter for inverting the refresh strobe;
   a second AND-gate for receiving the output of the inverter and the refresh counter address; and,
   an OR-gate for receiving the outputs of the first and second AND-gates and driving the row decoder.

5. The method of claim 1 wherein the memory further comprises an external row address which is disabled during the testing of the refresh counter.

6. A method of testing the operation of an internal refresh counter in a random access memory having an external address input a refresh signal input and write circuitry, comprising:
   writing a uniform background into the memory;
   selecting a row determined by the row address in said internal refresh counter in response to a refresh signal on said refresh signal input;
   enabling said write circuitry to write one or more bits in said selected row;
   sequentially repeating said selecting and enabling steps for all of the rows in said random access memory; and
   sequentially reading each row in said random access memory in response to externally determined row addresses provided on said external address input.

* * * * *